(12) United States Patent
Hall et al.

(10) Patent No.: US 7,212,934 B1
(45) Date of Patent: May 1, 2007

(54) STRING RESISTANCE DETECTOR

(75) Inventors: A. Daniel Hall, Friendswood, TX (US); Francis J. Davies, Friendswood, TX (US)

(73) Assignee: United States of America as represented by the Administrator of the National Aeronautics and Space Administration, Washington, DC (US)

(*) Notice: Subject to any disclaimer, the term of this patent is extended or adjusted under 35 U.S.C. 154(b) by 0 days.

(21) Appl. No.: 11/370,379

(22) Filed: Mar. 6, 2006

(51) Int. Cl.
*G01R 23/00* (2006.01)
*G01R 27/00* (2006.01)

(52) U.S. Cl. .............. 702/76; 702/65; 702/75

(58) Field of Classification Search ........... 702/65, 702/66, 75, 76, 189; 324/322, 426, 600; 333/17.3, 32
See application file for complete search history.

(56) References Cited

U.S. PATENT DOCUMENTS

| | | | |
|---|---|---|---|
| 6,167,349 A | 12/2000 | Alvarez | |
| 6,313,607 B1 | 11/2001 | Champlin | |
| 6,316,914 B1 | 11/2001 | Bertness | |
| 6,332,113 B1 | 12/2001 | Bertness | |
| 6,424,232 B1 * | 7/2002 | Mavretic et al. | 333/17.3 |
| 6,469,471 B1 | 10/2002 | Anbuky et al. | |
| 6,512,376 B2 | 1/2003 | Rosenau et al. | |
| 6,566,883 B1 | 5/2003 | Vonderhaar et al. | |
| 6,611,774 B1 | 8/2003 | Zaccaria | |
| 6,737,831 B2 | 5/2004 | Champlin | |
| 6,747,456 B2 | 6/2004 | Scott | |
| 6,765,388 B1 | 7/2004 | Clegg | |
| 6,778,913 B2 | 8/2004 | Tinnemeyer | |
| 6,781,382 B2 | 8/2004 | Johnson | |
| 6,871,151 B2 | 3/2005 | Bertness | |
| 2002/0021131 A1 | 2/2002 | Plow et al. | |
| 2002/0109506 A1 | 8/2002 | Kawakami et al. | |
| 2002/0180445 A1 | 12/2002 | Bertness et al. | |
| 2003/0048106 A1 | 3/2003 | Bertness et al. | |
| 2003/0139888 A1 | 7/2003 | Burns | |
| 2003/0206021 A1 * | 11/2003 | Laletin et al. | 324/426 |
| 2004/0036475 A1 | 2/2004 | Pascoe et al. | |
| 2004/0135544 A1 | 7/2004 | King et al. | |
| 2004/0199343 A1 | 10/2004 | Cardinal et al. | |
| 2005/0038614 A1 | 2/2005 | Botts et al. | |

* cited by examiner

*Primary Examiner*—Bryan Bui
(74) *Attorney, Agent, or Firm*—Theodore U. Ro

(57) ABSTRACT

Method and system are disclosed for determining individual string resistance in a network of strings when the current through a parallel connected string is unknown and when the voltage across a series connected string is unknown. The method/system of the invention involves connecting one or more frequency-varying impedance components with known electrical characteristics to each string and applying a frequency-varying input signal to the network of strings. The frequency-varying impedance components may be one or more capacitors, inductors, or both, and are selected so that each string is uniquely identifiable in the output signal resulting from the frequency-varying input signal. Numerical methods, such as non-linear regression, may then be used to resolve the resistance associated with each string.

22 Claims, 8 Drawing Sheets

STRING RESISTANCE DETECTOR

FIELD OF THE INVENTION

The present invention relates generally to electrical circuits and particularly to a method and system for determining resistance in an electrical circuit.

BACKGROUND OF THE INVENTION

Generally, in order to determine the resistance of an individual circuit element, such as a resistor, both the voltage across the element and the current through the element must be known. This principle is known by those having ordinary skill in the art as Ohm's law, which states that the resistance R is equal to the ratio of the voltage V over the current I(R=V/I). Unfortunately, it is not always possible or practical to know both the voltage V and the current I for every element in a given circuit.

One application for which it is not always practical to know both the voltage V and the current I for every element is a battery module. Battery modules are commonly employed when mobility and portability are required, for example, in electric automobiles, robotic systems, various types of protective suits, and the like. A typical battery module comprises a network of electrochemical cells connected, or strung, together to produce a certain amount of electric power. The exact number of cells in a given battery design depends on the amount of power required by the end equipment. These cells, or "strings," may be connected in parallel, in series, or a combination of both (e.g., several sets of parallel strings connected in series with one another).

An example of a battery module 10 with parallel connected strings is illustrated schematically in FIG. 1A. As can be seen, the network of strings may be represented as an electrical circuit, with the branches of the circuit representing the individual strings, S1, S2, S3, and S4. Each string S1–S4 may be modeled as a constant voltage source connected in series with a resistor R1, R2, R3, and R4. The total current through the battery module 10 at any given time is I and the voltage across the battery module 10 is V. A battery module 12 with series connected strings is illustrated schematically in FIG. 1B along with the total current and voltage therefor.

It is often useful to know the resistance R1, R2, R3, or R4 in a particular string of a battery module in order to determine the health of the battery. A higher-than-expected string resistance may indicate, for example, that the battery is malfunctioning and may need to be replaced. The most direct way to determine the string resistance is to divide the voltage across the string by the current through the string (R=V/I). However, while the voltage across each string in the parallel string battery 10 is readily available, the current through each string is not. Similarly, while the current through each string in the series string battery 12 is readily available, the voltage across each string is not. To obtain the current/voltage, a current/voltage meter usually has to be deployed across each string and the current/voltage measured. Such an arrangement is not always convenient or practical, especially if the battery module is surrounded by other equipment or difficult to access. And while remote or wireless monitoring of the string voltage and current is possible, actual implementation can be overly complicated and/or costly.

Accordingly, what is needed is a way to determine individual parallel-connected string resistance in a battery module when the current through each string is unknown, and a way to determine individual series-connected string resistance when the voltage across each string is unknown.

SUMMARY OF THE INVENTION

The present invention is directed to a method and system for determining individual string resistance in a network of strings when the current through a parallel connected string is unknown and when the voltage across a series connected string is unknown. The method/system of the invention involves connecting one or more frequency-varying impedance elements to each string and applying a frequency-varying input signal to the network of strings. The frequency-varying impedance elements may be one or more capacitors, inductors, or both, and are selected so that each string is uniquely identifiable in the output signal resulting from the frequency-varying input signal. Numerical methods, such as non-linear regression, may be used to resolve the resistance associated with each string.

In general, in one aspect, the invention is directed to a method of determining individual string resistance in a network of resistive strings, each resistive string having a unique preselected impedance connected thereto. The method comprises step of applying a frequency-varying input signal to the network such that portions of the frequency-varying input signal propagate through each resistive string of the network. The method further comprises step of recording an output signal from the network, the output signal resulting from the portions of the frequency-varying input signal propagating through the resistive strings of the network. The method finally comprises the step of determining a resistance for each resistive string in the network based on the frequency-varying input signal, the unique preselected impedance of each resistive string, and the output signal.

In general, in another aspect, the invention is directed to a computer-based system for determining individual string resistance in a network of resistive strings, each resistive string having unique preselected impedance connected thereto. The system comprises a computing unit and a waveform generator controllable by the computing unit to generate a frequency-varying input signal, the waveform generator connected to the network such that the frequency-varying input signal propagates through each resistive string of the network. The system further comprises a microcontroller controllable by the computing unit to record an output signal from the network, the output signal composed of the frequency-varying input signal propagating through the resistive strings of the network. The computing unit is programmed to determine a resistance for each resistive string in the network based on the frequency-varying input signal, the unique preselected impedance for each resistive string, and the output signal.

In general, in still another aspect, the invention is directed to a method of resolving a resistance of an individual string, the individual string part of a either a parallel string network or a series string network, using a single input signal and a single output signal of the parallel or the series string network. The method comprises the step of connecting a frequency-varying impedance component with known electrical characteristics in series with each individual string for the parallel string network or in parallel with each individual string for the series string network, or using multiple frequency-varying impedance components with known electrical characteristics both in parallel and series with each individual string for either the parallel or the series string network, wherein the electrical characteristics of the frequency-varying impedance component are based on network size, resistance resolution accuracy, and impedance characteristics needs. The method also comprises the step of applying the single input signal to the parallel or the series string network, the single input signal being a voltage signal for the parallel string network and a current signal for the series string network. The method further comprises the step of generating a symbolic representation of the single output signal as a function of the single input signal, the frequency-varying impedance component of each individual string, and the resistance of each individual string. The symbolic representation is curve-fitted to a plot of the single output signal resulting from application of the single input signal to the parallel or the series string network using non-linear regression, wherein the resistance for each individual string is a curve-fit parameter derived from the nonlinear regression. The method finally comprises the step of correlating the unique predetermined electrical characteristics of each frequency-varying impedance component to the resistance for each individual string to thereby identify a location of the individual string.

BRIEF DESCRIPTION OF THE DRAWINGS

The foregoing and other advantages of the invention will become apparent from the following detailed description and upon reference to the drawings, wherein.

DESCRIPTION OF ILLUSTRATIVE
EMBODIMENTS OF THE INVENTION

As mentioned above, embodiments of the invention provide a method and system for determining individual string resistance in a network of resistive strings where the current through parallel connected strings is unknown and the voltage across series connected strings is unknown. The method/system of the invention involves installing one or more frequency-varying impedance elements having known values to the individual strings. A frequency-varying input signal, which may be a step function or a steady-state periodic function, is then applied to the network of strings such that the signal propagates through all the strings and the installed elements. The resulting composite output signal from the network is then recorded and plotted, and a mathematical or symbolic representation of the expected output signal is generated from the known impedance elements previously installed. The symbolic representation is thereafter curve-fitted to the plot of the output signal using, for example, non-linear regression techniques. The coefficients of the symbolic representation that result in the best or closest fitting curve are used as the resistance values for the strings.

Figure 1A:
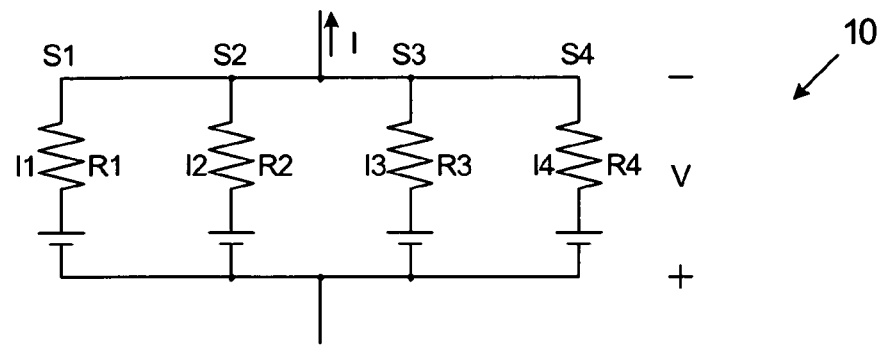
FIGS. 1A–1B illustrate a network of parallel connected and series connected strings represented as electrical circuits.
Figure 1B:
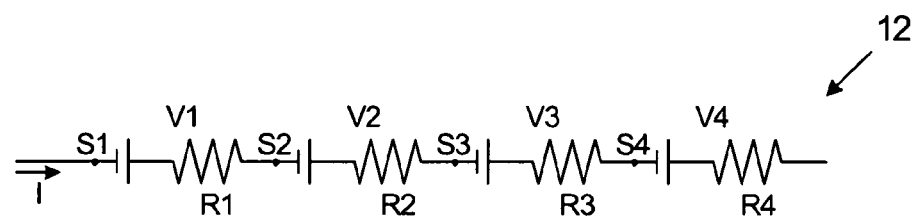
Figure 2:
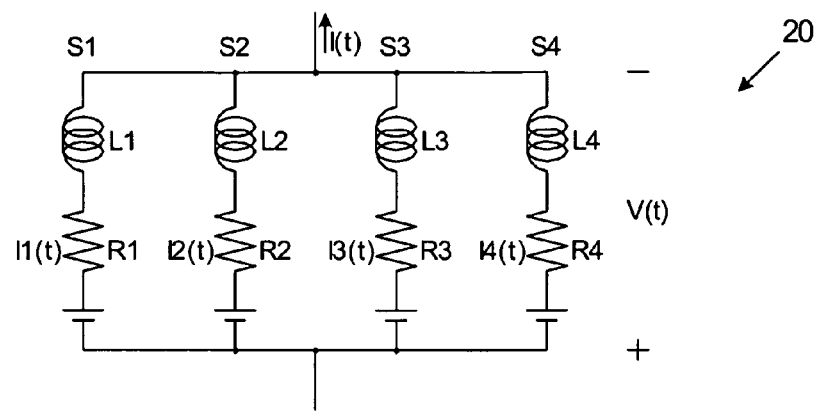
FIG. 2 illustrates a network of parallel connected strings according to embodiments of the invention.

FIG. 2 illustrates an electrical circuit representation of a battery module 20 according to one embodiment of the invention. As can be seen, the battery module 20 is otherwise identical to the battery module 10 of FIG. 1A in that each individual string S1, S2, S3, and S4 in the network of strings is represented as a voltage source connected in series with a resister R1, R2, R3, and R4. Unlike the battery module 10 of FIG. 1A, however, each string S1–S4 in the network of strings also has one or more frequency-varying impedance elements, for example, inductors L1, L2, L3, and LA, connected in series with the respective strings S1–S4. Furthermore, each inductor L1–L4 has a preselected inductance value that allows the inductors L1–L4 to be uniquely identified based on the composite output signal from the string network. The inductance values in this example are L1=0.1 mH, L2=0.15 mH, L3=0.2 mH, and L4=0.25 mH, although it should be clear to those having ordinary skill in the art that other inductance values may be used without departing from the scope of the invention.

To determine the string resistance values, a frequency-varying input signal is applied to the network of strings S1–S4 and the resulting composite output signal therefrom is plotted and recorded. Because the strings S1–S4 are connected in parallel in this example, the frequency-varying input signal selected is a constant voltage V step and the composite output signal recorded is a current I(t). Using well known circuit analysis techniques, the voltage across any string S1–S4 may be expressed in the form of a differential equation as:

$$V_{step} = OCV + I_i(t)R_i + L_i \frac{dI_i(t)}{dt} \quad (1)$$

where "OCV" is the open circuit voltage across the strings S1–S4. Similarly, the composite output signal I(t) may be expressed as:

$$I(t) = (V_{step} - OCV) \sum_{1}^{n} \frac{1 - e^{-1 * \frac{R_i}{L_i}}}{R_i} \quad (2)$$

Figure 3:
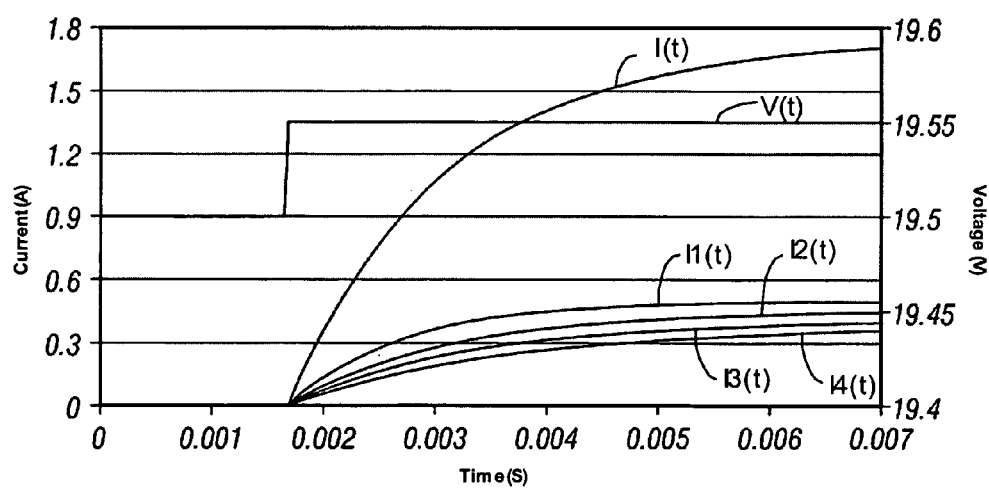
FIG. 3 illustrates the plots of the current through the individual strings and the total current for the network of FIG. 2.

A simulation of the step function input signal V(t) propagating through each string S1–S4 in the network (e.g., using Microsoft® Excel™) produces the composite output signal plotted in FIG. 3. In the plot, the left vertical axis represents current, the right vertical axis represents voltage, and the horizontal axis represents time. The plot of the step function input signal itself is also shown in FIG. 3, along with the output currents I1(t), I2(t), I3(t), and I4(t) through each string S1–S2, respectively. Equation (2) may thereafter be curve-fitted to the plot of the composite output signal using, for example, non-linear regression or other numerical techniques known to those having ordinary skill in the art. For more information regarding non-linear regression, the reader is referred to "Numerical Methods for Engineers," 2nd Edition, by Steven C. Chapra and Raymond P. Canale, page 359.

The non-linear regression may be performed using any suitable commercially available mathematical analysis and computation software, such as Maple™ from Maplesoft, Inc. It is also possible to perform the non-linear regression using a simple spreadsheet program (e.g., Microsoft® Excel™). In any event, the values in this example for R1–R4 that result in the best fit between Equation (2) and the plot of the output signal in FIG. 3 were determined to be: R1=100 mOhm, R2=110 mOhms, R3=120 mOhm, and R4=130 mOhm. These values for R1–R4 may then be adopted as the resistance values for the individual strings S1–S4 of the battery 20. Based on these resistance values, the current health of the battery 20 can be determined. And since non-linear regression can be performed very quickly in most modern computers, the health of the battery 20 can be established substantially in real time.

Because a step function is used as the input signal in the above example, however, care should be taken so that the input signal V(t) does not cause the output signal to be linearly dependent on its derivative. In other words, the input signal V(t) should change in a way such that $$\frac{dI}{dt} \neq \alpha I(t),$$

where α may be any proportionality constant. An example of such an input signal V(t) is a sinusoidal function or a slope function. Otherwise, the non-linear regression may provide inaccurate or skewed results due to insufficient information.

To alleviate the above potential concern were V(t) is a step function, one or more capacitors may be connected in parallel with each inductor L1–L4 in the strings S1–S4. An exemplary implementation of this parallel capacitor-inductor embodiment may be seen in FIG. 4, where a battery module 40 has one or more capacitors C1, C2, C3, and C4 added thereto. The battery module 40 is essentially identical to the battery module 20 of FIG. 2 except that each string S1–S4 has a capacitor C1, C2, C3, and C4 having a preselected capacitance value connected in parallel with the inductors L1–L4. The capacitance values should be sized according to the impedance needed and the accuracy of the available measurements. Using well known circuit analysis techniques, the following equations may be generated:

$$\frac{I_i(t)}{C_i L_i} = \frac{1}{C_i L_i} I_{pi}(t) + \frac{d^2 I_{pi}(t)}{dt^2} \quad (3)$$

$$\frac{(V_{step} - \sum OCV)}{C_i L_i R_i} = \frac{I_{pi}(t)}{C_i L_i} + \frac{1}{C_i R_i} \frac{dI_{pi}(t)}{dt} + \frac{d^2 I_{pi}(t)}{dt^2} \quad (4)$$

To solve these equations, first Equation (4) is solved for $I_{pi}$, the current in each inductor leg, by using second order differential equations techniques. That solution is then inserted into Equation (3) to generate the individual string currents $I_i$. Finally, the total current equation can be found by summing the individual strings.

Determination of the string resistance values R1–R4 for the network of strings of the battery module 40 may be performed in much the same way as in the case of the battery module 20 in FIG. 2. That is to say, a step function input signal V(t) may be applied to the network of strings and the resulting composite output signal plotted. Non-linear regression techniques may then be used to curve-fit Equation (3) to the composite output signal. This technique is well known to those having ordinary skill in the art and will therefore not be described in detail here. It is suffice to say that the non-linear regression allows the calculation of resistance values for each known parallel capacitor-inductor couple, which in turn allows the hardware location of the parallel capacitor-inductor couple to be traced.

Figure 4:
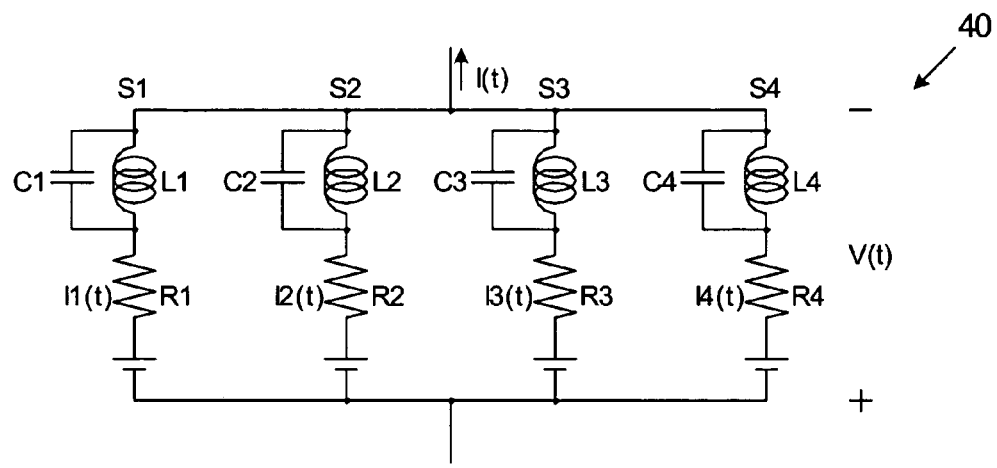
FIG. 4 illustrates another network of parallel connected strings according to embodiments of the invention.

A number of advantages exist for the embodiments of the invention according to FIG. 4. For one thing, any linear dependence on a step function input signal is reduced. This is because in FIG. 2, the solution is a single exponential function I(t)=$e^{at}$ that is linearly dependent on its derivative and $$\frac{dI}{dt} = ae^{at},$$

but the solution in FIG. 4 has two exponential functions, $$I(t) = e^{at} + e^{bt}$$

and therefore $$\frac{dI}{dt} = ae^{at} + be^{bt},$$

which is not linearly dependent. In addition, introducing a known capacitive component provides more resolving power to the non-linear regression analysis, thus allowing for the resistance determination of a higher number of strings.

In some embodiments, instead of a step function, the frequency-varying input signal V(t) may be a steady-state alternating (e.g., sinusoidal) input signal, such as V(t)=$V_0\cos(\omega t)$, where ω represents the angular frequency. Such a steady-state alternating input signal has been found to be less sensitive to signal noise than a step function input signal and is therefore more robust. To determine the string resistance, one or more frequency-varying elements are connected to the individual strings S1–S4 of the network of strings of the battery module. The values of the frequency-varying elements are preselected so that each string has a known and uniquely identifiable resonance frequency. The steady-state alternating input signal V(t) is then swept across a range of frequencies, for example, 0 kHz to 10 kHz, for all strings S1–S4. Only the frequency or frequencies that are substantially equal to the resonance frequency or frequencies of a given string are allowed to pass while the remaining frequencies are substantially suppressed. Consequently, the composite output signal will have a plurality of peaks at various frequencies corresponding to the resonance frequency or frequencies of the individual strings S1–S4. The resistance associated with the peaks may then be traced back to an individual string based on the resonance frequency or frequencies of the individual string.

Figure 5:
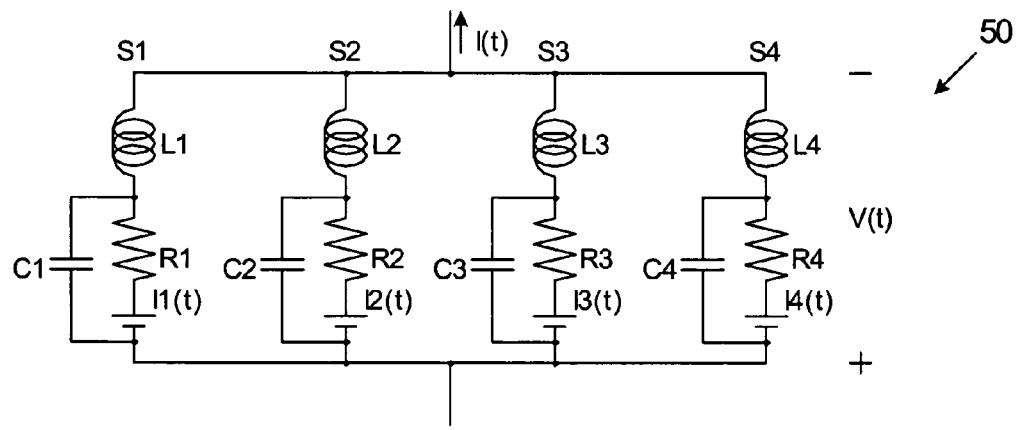
FIG. 5 illustrates yet another network of parallel connected strings according to embodiments of the invention.

An exemplary implementation of the above embodiments is illustrated in the battery module 50 of FIG. 5. As can be seen, each string S1–S4 in the network of strings of the battery module 50 includes at least one inductor connected in series with the string and at least one capacitor connected in parallel with the string. The inductive values and capacitive values of these elements are preselected so that each string has a uniquely identifiable resonance frequency. Standard circuit analysis techniques reveal the following equations for the battery module 50:

$$\frac{I_i(t)}{C_i R_i} = \frac{1}{C_i R_i} I_{pi}(t) + \frac{dI_{pi}(t)}{dt} \quad (4)$$

$$V(t) = V_0 \cos(w_0 t) \quad (5)$$

$$\frac{(V(t) - OCV)}{C_i L_i R_i} = \frac{I_{pi}(t)}{C_i L_i} + \frac{1}{C_i R_i} \frac{dI_{pi}(t)}{dt} + \frac{d^2 I_{pi}(t)}{dt^2} \quad (6)$$

where $I_{pi}$ is the current though the capacitive branch, $I_i$ is the current in each parallel string S1–S4, and $C_i$ is the capacitance of the capacitor in the ith branch while $R_i$ is the ohmic resistance of the string.

An alternating input voltage signal is then swept across the network of strings S1–S4 over a predefined range of frequencies. Based on the steady-state solution of Equations (4)–(6), the alternating input voltage signal induces a current through each string that can be expressed as follows:

$$I_{string} = -\frac{V_0\left(-\cos\left(wt + \arctan\left(\frac{wL_i}{R_i(-1 + w^2 C_i L_i)}\right)\right) + \sin\left(wt + \arctan\left(\frac{wL_i}{R_i(-1 + w^2 C_i L_i)}\right)\right) w C_i R_i\right)}{C_i L_i R_i \sqrt{\frac{R_i^2 - 2R_i^2 w^2 C_i L_i + R_i^2 w^4 C_i^2 L_i^2 + w^2 L_i^2}{C_i^2 L_i^2 R_i^2}}} \quad (7)$$

where $V_0$ is the voltage amplitude of the input signal across the strings S1–S4 and ω again represents the angular frequency. The composite output current may then derived by summing the current through the individual strings S1–S4, expressed as:

$$I_{total} = \sum_{i=1}^{n} \left( -\frac{V_0\left(-\cos\left(wt + \arctan\left(\frac{wL_i}{R_i(-1 + w^2 C_i L_i)}\right)\right) + \sin\left(wt + \arctan\left(\frac{wL_i}{R_i(-1 + w^2 C_i L_i)}\right)\right) w C_i R_i\right)}{C_i L_i R_i \sqrt{\frac{R_i^2 - 2R_i^2 w^2 C_i L_i + R_i^2 w^4 C_i^2 L_i^2 + w^2 L_i^2}{C_i^2 L_i^2 R_i^2}}} \right) \quad (8)$$

Non-linear regression may then be used to curve-fit Equation (8) to a plot of the composite output signal to determine the resistance value for each string in the manner similar to that described above. Alternatively, because the resonance frequency or frequencies of each string are known, non-linear regression may be used to curve-fit Equation (7) to only the portion of the plot of the composite output signal surrounding the resonance frequency or frequencies of the string.

Figure 6:
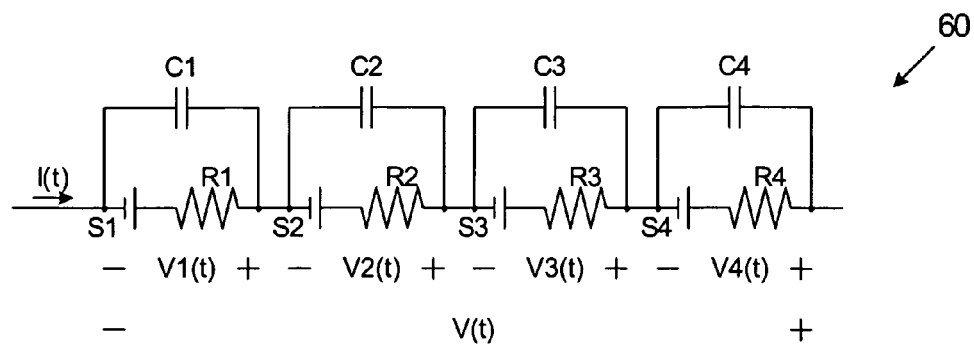
FIG. 6 illustrates a network of series connected strings according to embodiments of the invention.

Thus far, the invention has been described with respect to battery modules having parallel-connected strings S1–S4. FIG. 6 illustrates an embodiment of the invention in which a battery module has series-connected strings S1–S4. As can be seen, a battery module 60 has a network of strings, each string S1, S2, S3, and S4 connected in series with one another. One or more frequency-varying elements may then be connected across each string S1–S4.

In the exemplary implementation of FIG. 6, the frequency-varying components are capacitors C1, C2, C3, and C4, each capacitor having a known capacitive value. Because the strings S1–S4 are connected in series, the frequency-varying input signal that is applied to the network of strings is a current signal I(t), a step function in this example. The resulting output signal is therefore a composite voltage signal V(t) comprised of the individual voltages V1(t), V2(t), V3(t), and V4(t) across each string S1–S4. Using well known circuit analysis techniques, the equations for the battery module 60 may be expressed as:

$$\frac{I_{step}}{C_i R_i} = \frac{1}{C_i R_i} I_i(t) + \frac{dI_i(t)}{dt} \quad (9)$$

$$\left(V_{total}(t) - \sum OCV\right) = \sum_{n=1}^{n} I_i(t) R_i \quad (10)$$

$$\left(V(t) - \sum OCV\right) / I_{step} = \sum_{n=1}^{n} (1 - e^{-t/C_i R_i}) R_i \quad (11)$$

where $I_{step}$ is a step function and also the total current through the battery module 60, V(t)-ΣOCV is the transient voltage response, and $I_i$ is the current in the battery string. Upon solving for V(t), Equation (11) may be curve-fitted to a plot of the composite output signal using non-linear regression in a manner similar to that described above to derive the resistance value for each string S1–S4.

Figure 7:
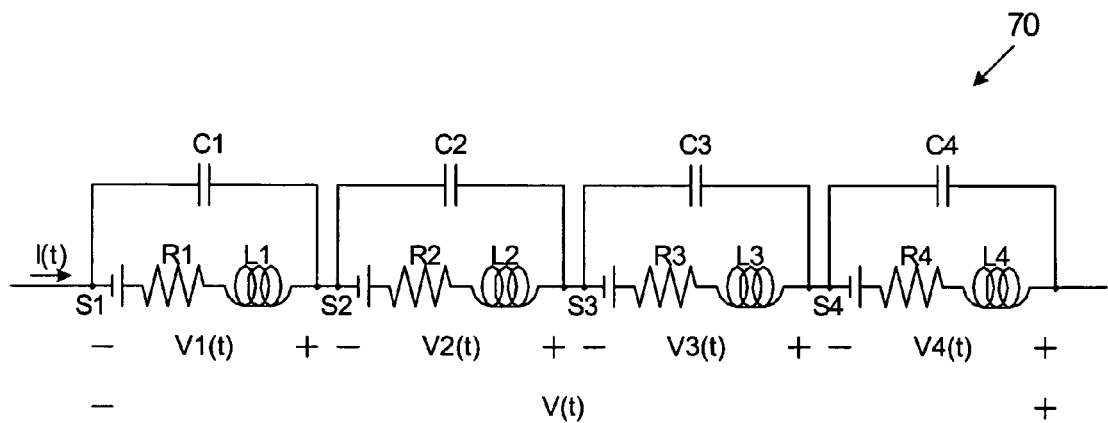
FIG. 7 illustrates another network of series connected strings according to embodiments of the invention.

FIG. 7 illustrates an exemplary implementation of a battery module 70 in which, instead of a step function, a steady-state alternating input current signal, $I(t)=I_0\cos(\omega t)$, is swept across the network of strings S1–S4 over a predefined range of frequencies. The network of strings S1, S2, S3, and S4 in this example have both capacitive and inductive elements connected thereto. As can be seen, each string S1–S4 has an inductor L1, L2, L3, and L4 connected in series therewith and a capacitor C1, C2, C3, and C4 connected in parallel with the series connected string-inductor combination. Standard circuit analysis techniques reveal the following equations for the battery module 70, where n is the number of strings:

$$\frac{I_{total}(t)}{C_i L_i} = \frac{1}{C_i L_i} I_i(t) + \frac{R_i}{L_i} \frac{dI_i(t)}{dt} + \frac{d^2 I_i(t)}{dt^2} \quad (12)$$

$$V(t) - \sum OCV = \sum_{n=1}^{n} \left( I_i(t) R_i + L_i \frac{dI_i(t)}{dt} \right) \quad (13)$$

Summing the voltages across each string S1–S4 results in a composite output voltage signal that may be expressed as Equation (14), with the open circuit voltages (OCV) subtracted out:

$$: V_{total} = \sum_{i=1}^{n} \left( \frac{I_0\left(-\cos\left(wt + \arctan\left(\frac{w R_i C_i}{-1 + w^2 C_i L_i}\right)\right) R_i + \sin\left(wt + \arctan\left(\frac{w R_i C_i}{-1 + w^2 C_i L_i}\right)\right) w L_i\right)}{C_i L_i^2 \sqrt{\frac{1 - 2w^2 C_i L_i + w^4 C_i^2 L_i^2 + w^2 R_i^2 C_i^2}{C_i^2 L_i^2}}} \right) \quad (14)$$

Equation (14) may then be curve-fitted to a plot of the composite output signal using non-linear regression in a manner similar to that described above to derive the resistance value for each string S1–S4.

In some implementations, the impedance of the power source (i.e., a waveform generator) may limit the current response for resonant circuits of the type discussed thus far (i.e., circuits with passive resonance). The resonance of these circuits may also be sensitive to the ohmic impedance of the frequency-varying impedance elements (e.g., inductors) themselves in most cases. For these cases, the impedances should be accounted for in the design and simulation of the circuit in order to avoid inaccurate results.

Accordingly, in some embodiments, a filtering circuit may be used with each string instead of a resonant circuit to determine the individual string resistance. The filtering circuit is designed so that the network of strings of the battery module has low impedance for low-frequency signals (e.g., direct current (DC) signals) and high impedance for certain high frequency signals. It is believed that such a filtering circuit will help alleviate any potential problems caused by the ohmic impedance of the elements themselves.

An exemplary implementation of the above filtering circuit was previously described and illustrated schematically in FIG. 4. However, to illustrate the robust nature of the filtering with respect to the ohmic impedance of the circuit elements, the battery module of FIG. 4 may be modified to add the ohmic impedance of the individual impedance elements, as shown in the battery module 80 of FIG. 8. Furthermore, instead of a step function as the input voltage, an alternating function such as $V(t)=V_0\cos(\omega t)$ is used with a frequency sweep generated over the frequencies of interest.

Figure 8:
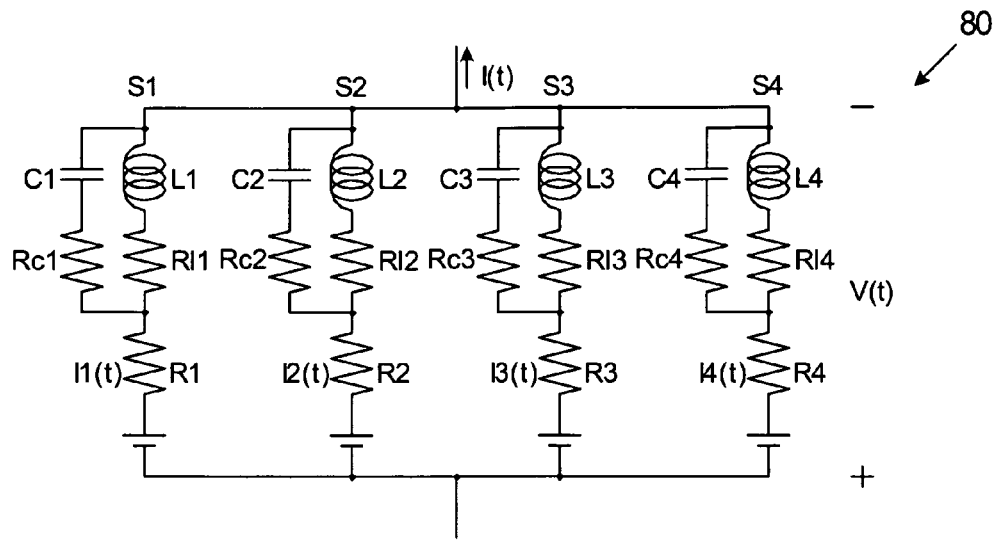
FIG. 8 illustrates a network of parallel connected strings having filtering circuits according to embodiments of the invention.

In FIG. 8, the battery module 80 is represented as having a single filtering circuit per string S1–S4, where capacitors C1, C2, C3, and C4 and inductors L1, L2, L3, and LA are selected to provide certain predetermined high impedance frequencies for each string. Resistances Rc1, Rc2, Rc3, and Rc4 and R11, R12, R13, and R14 are used to represent the ohmic impedance of the circuit elements. Using well known circuit analysis techniques, the following equations may be generated, with the open circuit voltages excluded for simplicity:

$$\frac{Q_i(t)}{C_i} + \left(\frac{d}{dt}Q_i(t)\right)Rc_i = L_i\left(\frac{d}{dt}IL_{i-leg}(t)\right) + IL_{i-leg}(t)RL_i \quad (15)$$

$$Istring_i(t) - IL_{i-leg}(t) = \frac{d}{dt}Q_i(t) \quad (16)$$

$$Istring_i(t) = -\frac{-V(t) + \frac{Q_i(t)}{C_i} + \left(\frac{d}{dt}Q_i(t)\right)Rc_i}{R_i} \quad (17)$$

where $Q_i(t)$ is the charge in the capacitor and $IL_{i-leg}$ represents the current in the inductor leg of the ith string (each string has an inductor leg and a capacitor leg). These equations may be manipulated algebraically to produce a function of voltage and charge $Q_i(t)$ as below:

$$L_i\left(\frac{d}{dt}V(t)\right)C_i + Rl_iV(t)C_i = (L_iC_iR_i + L_iRc_iC_i)\left(\frac{d^2}{dt^2}Q_i(t)\right) + \\ (R_i + Rl_i)Q_i(t) + ((Rc_iC_i + Rl_iC_i)R_i + L_i + Rl_iRc_iC_i)\left(\frac{d}{dt}Q_i(t)\right) \quad (18)$$

To solve Equation (18), a substitution of $V(t)=V_0\cos(\omega t)$ is made and the equation is solved for $Q1(t)$ using standard differential equation techniques. After the steady-state solution is extracted, the modified output $Q_i(t)$ is inserted in (17) along with $V(t)=V_0\cos(\omega t)$ producing a function of voltage amplitude $V_0$ and string current $Istring_i(t)$. Finally the total current equation can be found by summing the equations describing each respective $Istring_i(t)$ with its unique $C_i$ and $L_i$. The final equation may then be curve-fitted to a plot of the composite output signal using non-linear regression in the manner described previously.

Figure 9:
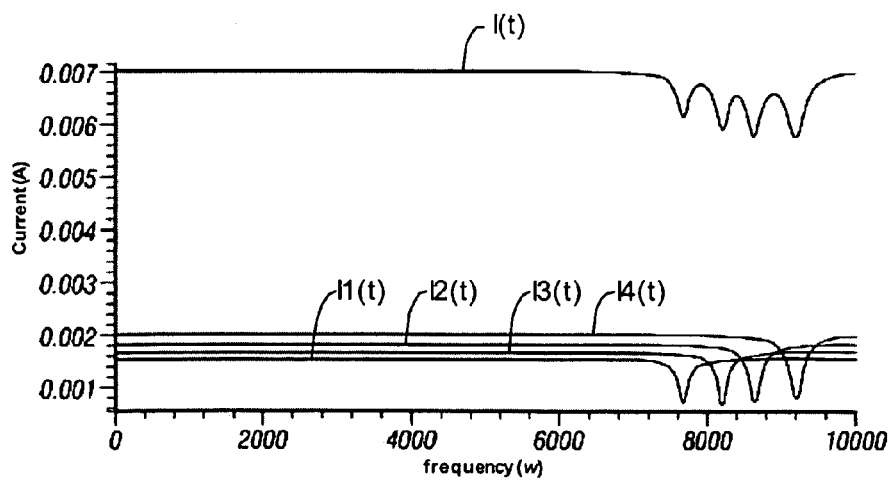
FIG. 9 illustrates a plot of the amplitudes of the output currents through the individual strings and the total output current through the network of FIG. 8.
Figure 10:
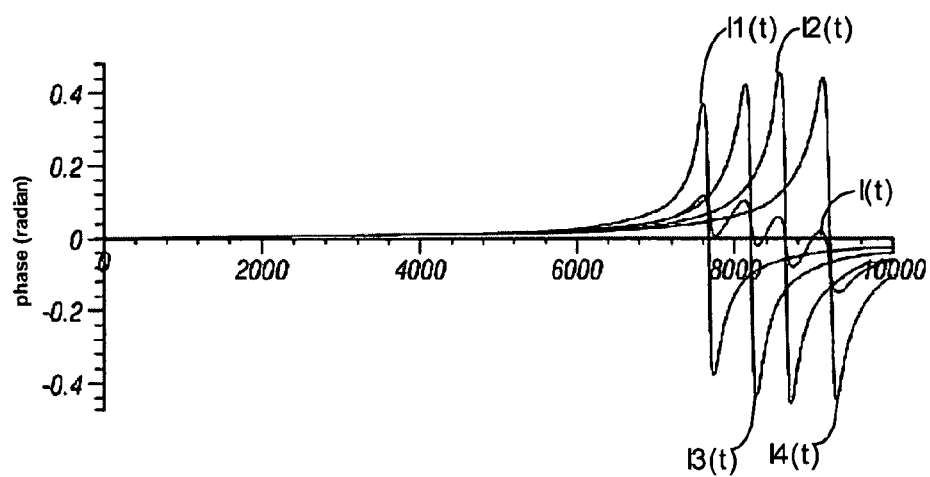
FIG. 10 illustrates a plot of the phases of the output currents through the individual strings of the network of FIG. 8 according to embodiments of the invention.

A simulated composite output signal from the battery module 80 is illustrated in FIG. 9 along with the currents through the individual strings S1–S4. In FIG. 9, the vertical axis represents current amplitude and the horizontal axis represents angular frequency. The values of the frequency-varying impedance elements used in simulation, and the passive resistances therefor, are as follows: V0=2V L1=300 uH; C1=1 uF; L2=340 uH; C2=1 uF; L3=360 uH; C3=1.05 uF; L4=360 uH; C4=1.2 uF; Rc1=100 mOhm; Rc2=100 mOhm; Rc3=100 mOhm; Rc4=100 mOhm; R11=100 mOhm; R12=100 mOhm; R13=100 mOhm; R14=100 mOhm. The simulation was conducted using the Maple™ symbolic analysis and computational software and produced a closed form solution. Because the closed form solution is known, the resistance values for each string S1–S4 may be extracted from the data by a parameter curve-fit, resulting in the following resistance values: R1=1000 mOhm; R2=1100 mOhm; R3=1200 mOhm; R4=1300 mOhm;

Furthermore, the phase angle may be calculated from manipulation of the solution of Equations (15) though (16). After summing the four strings, the equation can be separated into two components, one with a sine term and the other with a cosine term. The phase then may be calculated by taking the arc tan of the sine terms divided by the cosine terms. The plot of the phase angle of each string is shown in FIG. 10 and the equation for each phase angle may be expressed as:

$$StringPhase = \arctan\left(\frac{(-L_i^2\varpi^2 C_i + L_i\varpi^2 Rc_i^2 C_i^2 + L_i - Rl_i^2 C_i)\varpi}{\begin{array}{l}L_i^2 C_i^2\varpi^4 R_i + L_i^2 C_i^2\varpi^4 Rc_i - 2L_iC_i\varpi^2 R_i + \\ 2C_i^2 R_i\varpi^2 Rc_i Rl_i + C_i^2\varpi^2 R_i Rc_i^2 + C_i^2 R_i\varpi^2 Rl_i^2 + \\ \varpi^2 Rc_i^2 C_i^2 Rl_i + \varpi^2 Rl_i^2 C_i^2 Rc_i + R_i + Rl_i\end{array}}\right) \quad (19)$$

In addition, to improve the performance of the filtering circuit, a parallel circuit may be included with each string. The circuit may be designed for a sharper filter at specific frequencies while not affecting the direct current impedance. Moreover, when simulating the network of strings of the battery module, the passive (i.e., non-frequency-varying) resistance of the frequency-varying impedance elements may be included in the simulation in order to provide a more accurate simulation.

Figure 11:
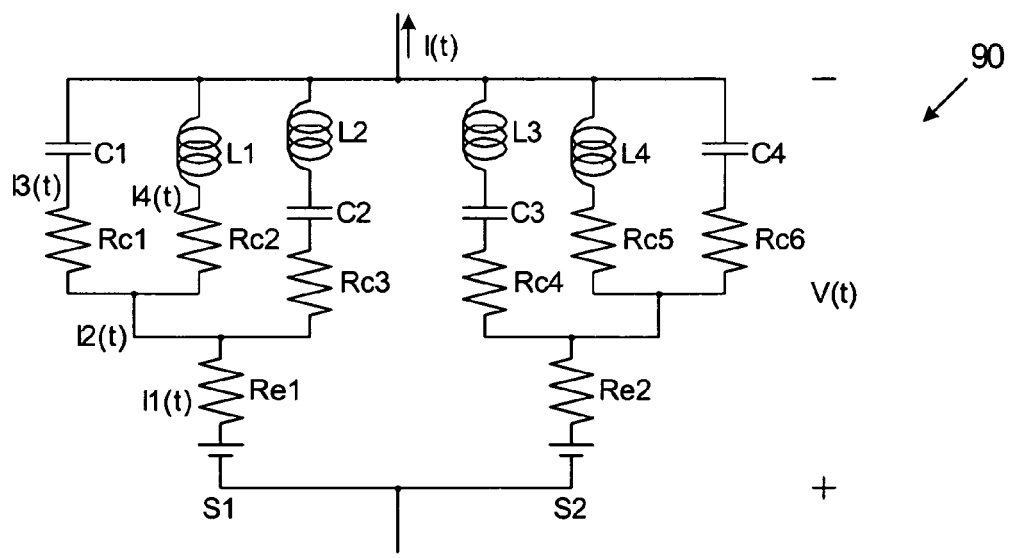
FIG. 11 illustrates another network of parallel connected strings having filtering circuits according to embodiments of the invention.

An exemplary implementation of the above filtering circuit is illustrated schematically in FIG. 11, where a battery module 90 is represented as having two parallel connected strings S1 and S2 that form the network of strings. Each string S1–S2 is once again represented by a constant voltage source connected in series with a resistor Re1 and Re2. In addition, each string S1–S2 also has a filtering circuit comprised of a parallel combination of a capacitor and an inductor connected in parallel with a series combination of a capacitor and an inductor. In the first string S1, for example, the parallel combination of capacitor C1 and inductor L1 is connected in parallel with the series combination of capacitor C2 and inductor L2. The passive resistance for each frequency-varying impedance element is also included, for example, resistor Rc1 for capacitor C1, resistor Rc2 for inductor L1, and resistor Rc3 for capacitor C2 and inductor L2. Similarly for the second string S2, the series combination of inductor L3 and capacitor C3 is connected in series with the parallel combination of inductor L4 and capacitor C4. The passive resistances for these frequency-varying impedance elements are resistor Rc4 for inductor L3 and capacitor C3, resistor Rc5 for inductor L4, and resistor Rc6 for capacitor C4.

To determine the individual string resistance, an alternating input voltage signal, for example, $V(t)=V_0\cos(\omega t)$, is applied to the strings S1–S2 over a predefined range of frequencies (e.g., 0 kHz to 10 kHz). Using standard circuit analysis techniques, the equation for the current through each string may be expressed as:

$$V(t) = L1\left(\frac{d}{dt}I4(t)\right) + Rc2 I4(t) + R_{e1}I1(t) \quad (20)$$

$$I1(t) - I2(t) = \frac{d}{dt}Q2(t) \quad (21)$$

$$I2(t) - I4(t) = \frac{d}{dt}Q1(t) \quad (22)$$

$$\frac{Q1(t)}{C1} + Rc1\left(\frac{d}{dt}Q1(t)\right) = L1\left(\frac{d}{dt}I4(t)\right) + Rc2 I4(t) \quad (23)$$

$$L2\left(\frac{d^2}{dt^2}Q2(t)\right) + Rc3\left(\frac{d}{dt}Q2(t)\right) + \frac{Q2(t)}{C2} = L1\left(\frac{d}{dt}I4(t)\right) + Rc2 I4(t) \quad (24)$$

Expanding and algebraically manipulating Equations (20) through (24) and substituting $V(t)=V_0\cos(\omega t)$ result in the following single equation:

$$-V_0(-R3C2\varpi - C1Rc1\varpi + C1Rc1L2C2\varpi^3)\sin(\varpi t) - \quad (25)$$
$$V_0(1 - C2L2\varpi^2 - C2Rc3C1Rc1\varpi^2)\cos(\varpi t) =$$
$$(-R_{e1} - Rc2)I4(t) + \Big(-R_{e1}C1Rc2 - R_{e1}Rc3c2 - R_{e1}Rc2C2 -$$
$$L1 - R_{e1}C1Rc1 - C1Rc1Rc2 - Rc3C2Rc2\Big)\left(\frac{d}{dt}I4(t)\right) +$$
$$(-R_{e1}C1Rc1Rc2C2 - C2Rc3C1Rc1Rc2 - Rc3C2L1 -$$
$$R_{e1}C1L1 - C1Rc1L1 - C2L2Rc2 - R_{e1}C1Rc1Rc3C2 -$$
$$R_{e1}L1C2 - R_{e1}C1Rc3C2Rc2 - R_{e1}L2C2\Big)\left(\frac{d^2}{dt^2}I4(t)\right) +$$
$$(-C2L2L1 - C1Rc1L2C2Rc2 - R_{e1}C1L2C2Rc2 -$$
$$R_{e1}C1Rc3C2L1 - R_{e1}C1Rc1L2C2 -$$
$$C2Rc3C1Rc1L1 - R_{e1}C1Rc1L1C2\Big)\left(\frac{d^3}{dt^3}I4(t)\right) +$$
$$\Big(-R_{e1}C1L2C2L1 - C1Rc1L2C2L1\Big)\left(\frac{d^4}{dt^4}I4(t)\right)$$

Equation (25) may be solved via differential equations techniques using Maple™ in a manner known to those having ordinary skill in the art. The steady-state solution, meaning the solution after any transient signal has dissipated, was extracted to obtain $I4(t)$. This was then inserted into Equation (20), where $I1(t)$ was then generated. Once the current for the each string is generated as a function of the voltage amplitude, the sum total of all string currents can be manipulated and plotted. The solution to Equation (25) can then be plotted and curve-fitted to the composite output signal using non-linear regression in the manner described above.

Figure 12:
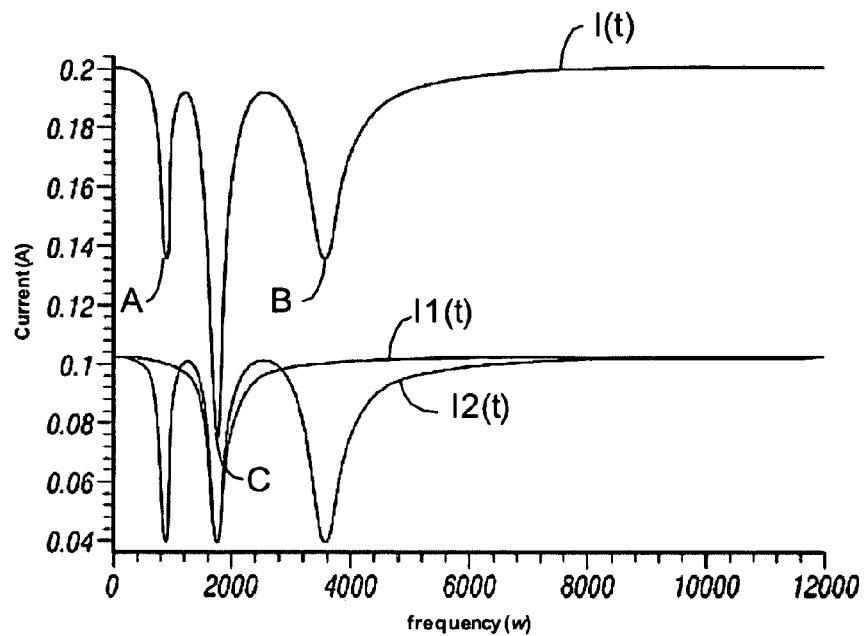
FIG. 12 illustrates a plot of the amplitudes of the output currents through the individual strings and the total output current through the network of FIG. 11.

A simulated composite output signal from the battery module 90 is illustrated in FIG. 12 along with the currents through the individual strings S1–S2. In FIG. Low, the vertical axis represents current amplitude and the horizontal axis represents angular frequency. The values of the frequency-varying impedance elements used in the simulation, and the passive resistances therefor, are as follows: L1=20 uH; C1=0.8 mF; L2=40 uH; C2=0.4 mF; Rc1=8 mOhm; Rc2=8 mOhm; Rc3=15 mOhm; L3=10 uH; C3=0.4 mF; L4=20 uH; C4=0.2 mF; Rc4=8 mOhm; Rc5=8 mOhm; Rc6=15 mOhm. The simulation was again conducted using the Maple™ symbolic analysis and computational software and produced a closed form solution. The simulation was also completed numerically using OrCAD™, with identical results. Because the closed form solution is known, the resistance values for each string S1–S2 may be extracted from the data by a parameter curve-fit, resulting in the following resistance values: Re1=0.5 Ohm and Re2=0.5 Ohm. The second plot FIG. 9B shows the same parameters but with resistance values: Re1=0.6 Ohm and Re2=0.4 Ohm.

Figure 13:
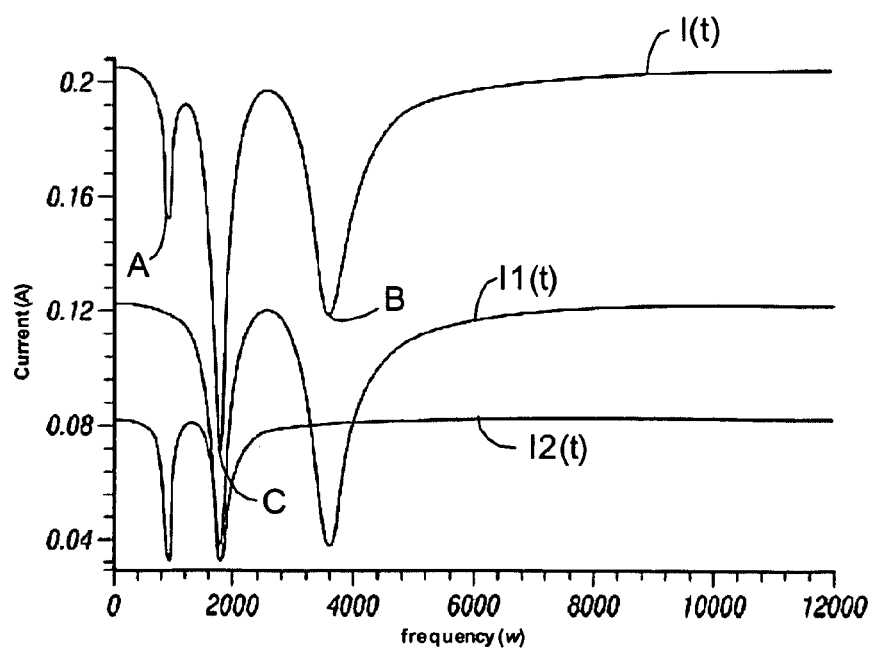
FIG. 13 illustrates another plot of the amplitudes of the output currents through the individual strings and the total output current through the network of FIG. 11.

In addition to curve-fitting the current derived from Equations (20) though (25) using non-linear regression, it is also possible to determine the relative string resistance values Re1 and Re2 by observing the relative amplitudes of the peaks in the composite output signal. As can be seen in FIGS. 12 and 13, there are two peaks A and B in the composite output signal I(t), one for the current $I1(t)$ through the first string S1 and another for the current $I2(t)$ through the second string S2. By observing the ratio of the two peaks A and B, and also the composite peak C the relative resistance of the two strings may be deduced.

Figure 14:
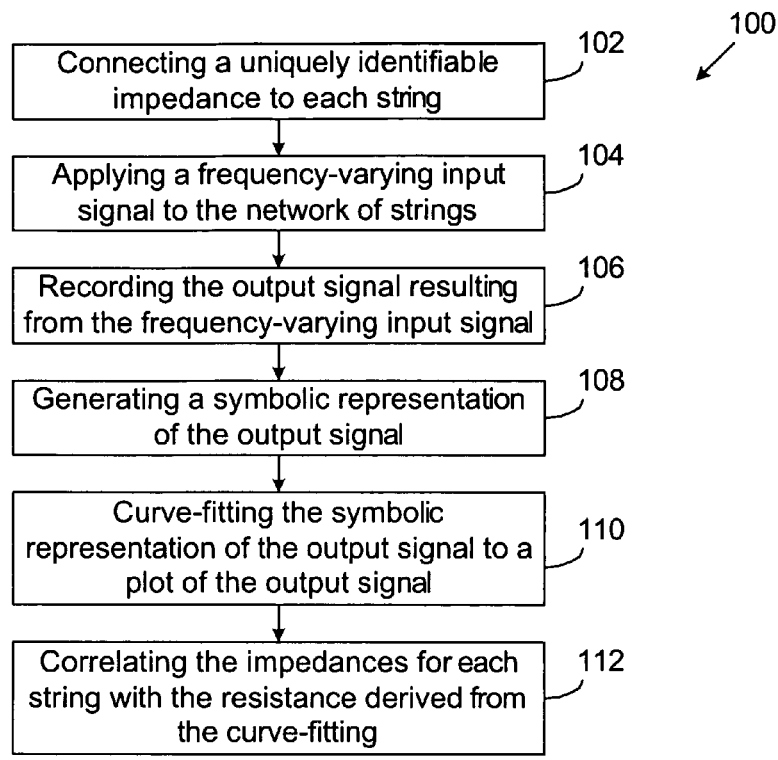
FIG. 14 illustrates a method of determining individual string resistance in a network of resistive strings according to embodiments of the invention.

FIG. 14 illustrates a method 100 according to embodiments of the invention that may be used to determine individual string resistances in a battery module. The method begins at step 102 where uniquely identifiable impedance is connected to each string of the network of strings via one or more frequency-varying impedance components. The impedance may be capacitive impedance, inductive impedance, or combination of both. At step 404, a frequency-varying input signal is applied to the network of strings. The frequency-varying input signal may be a voltage signal for parallel connected strings, or it may be a current signal in the case of series connected strings. Furthermore, the frequency-varying input signal may have a step function waveform, or it may have an alternating waveform that is swept over a predefined range of frequencies.

An output signal, which is a composite of the frequency-varying input signal propagating through each string of the network, is then recorded and plotted at step 106. A step 108, a symbolic representation of the output signal is generated using circuit analysis techniques well known to those having ordinary skill in the art. Numerical methods, such as non-linear regression, may then be used to curve fit the symbolic representation of the output signal to the plotted output signal at step 110. The coefficients resulting in the best fit for the symbolic representation may then be used as the resistance values for the strings. The resistance values may then be correlated to the individual strings based on the uniquely identifiable impedances connected to each string at step 112.

Figure 15:
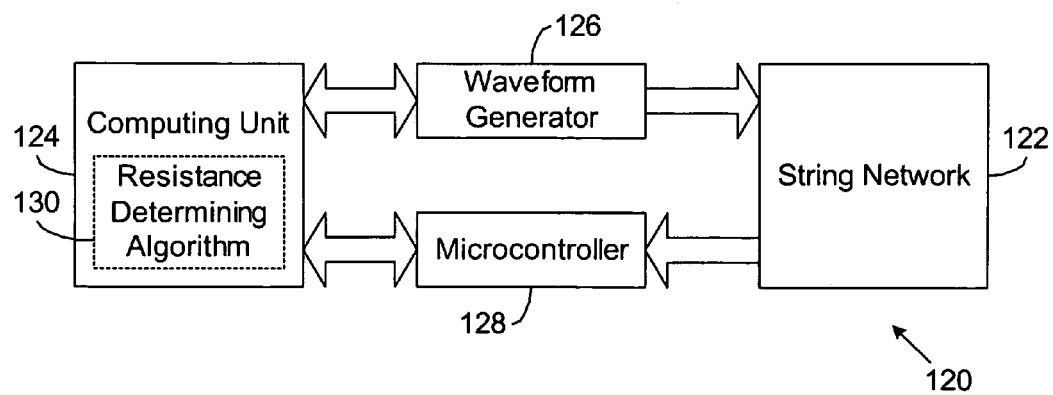
FIG. 15 illustrates a system for determining individual string resistance in a network of resistive strings according to embodiments of the invention.

FIG. 15 illustrates a system 120 that may be used to determine the individual string resistance a network of resistive strings 122. The network of resistive strings 122 may be a battery module, in which case the system 120 may be part of a battery charger, or the network of resistive strings 122 may be a network of thermistors, in which case the system 120 may be part of a temperature monitor/control system. The network of resistive strings 122 may be a fuel cell stack with multi-cell series string, in which case the system 120 will be a monitoring system, or the network of resistive strings 122 may be a series of resistive string gauges, in which case the system 120 may be a monitoring system. In addition, the individual strings of the network of resistive strings 122 may be connected in parallel, in series, and in some cases both in parallel and in series. Although not visible here, each string within the network of resistive strings 122 has one or more unique and known frequency-varying impedance elements connected thereto that endows each string with uniquely identifiable impedance.

Also present in the system 120 is a computing unit 124. The computing unit 124 is connected to a waveform generator 126 and a microcontroller 128. The waveform generator 126 is controllable by the computed unit 124 to generate a frequency-varying voltage signal or a frequency-varying current signal. The voltage/current signal may have a step function, or slope function, waveform or it may have an alternating (e.g., sinusoidal) waveform or have a white noise signature. In the latter case, the waveform generator 126 may modify the frequency of the alternating waveform from 0 kHz to a maximum frequency specified by equipment specification. The microcontroller 128 records the composite output voltage/current from the network of resistive strings 122 and provides this information to the computing unit 124.

In operation, a resistance determining algorithm 130 stored within the computing unit 124 controls the waveform generator to generate a frequency-varying input voltage/current signal to the network of resistive strings 122. The resistance determining algorithm 130 may be stored in a solid-state storage (e.g., RAM, ROM, Flash Memory, etc.) of the computing unit 124, or it may be stored in an optical or magnetic storage (e.g., CD-ROM, hard disk, etc.) of the computing unit 124, or both. In one embodiment, the resistance determining algorithm 130 may carry out the steps 104 to 122 of the method 100 in FIG. 11 and may be implemented using any suitable programming language.

Upon receiving instructions from the computing unit 124 (and the resistance determining algorithm 130), the waveform generator 126 generates an input voltage/current signal that is propagated through each string within the network of resistive strings 122. The microcontroller 128 then acquires the resulting composite output signal from the network of resistive strings 122, the composite output signal typically being available only from a single terminal. The composite output signal is thereafter provided to the computing unit 124 and processed by the resistance determining algorithm 130 to determine the resistance of the individual strings in the network of resistive strings 122 in a manner similar to that described above.

While the present invention has been described with reference to one or more particular embodiments, those skilled in the art will recognize that many changes may be made thereto without departing from the spirit and scope of the invention. For example, those having ordinary skill in art understand that numerous circuit designs exist that can perform the same functions as the specific electrical circuits described herein. Therefore, each of the foregoing embodiments and obvious variations thereof is contemplated as falling within the spirit and scope of the claimed invention, which is set forth in the following claims.

What is claimed is:

1. A method of determining individual string resistance in a network of resistive strings, each resistive string having a unique preselected impedance connected thereto, comprising the steps of:

applying a frequency-varying input signal to said network such that portions of said frequency-varying input signal propagate through each resistive string of said network;

recording an output signal from said network, said output signal resulting from said portions of said frequency-varying input signal propagating through said resistive strings of said network; and determining a resistance for each resistive string in said network based on said frequency-varying input signal, said unique preselected impedance of each resistive string, and said output signal, wherein said step of determining comprises relating said frequency-varying input signal, said unique preselected impedance for each resistive string, said resistance for each resistive string, and said output signal to each other in one or more mathematical equations and curve-fitting said one or more mathematical equations to a plot of said output signal.

2. The method according to claim 1, wherein at least two resistive strings in said network have different resistances.

3. The method according to claim 1, wherein said frequency-varying input signal has a known step slope or transient waveform.

4. The method according to claim 1, wherein said frequency-varying input signal has an alternating waveform, further comprising sweeping said frequency of said alternating waveform through a predetermined range of frequencies.

5. The method according to claim 1, further comprising arranging said unique preselected impedance for each resistive string so that said network has a high or low impedance only for certain frequencies of said frequency-varying input signal.

6. The method according to claim 1, wherein said step of curve-fitting comprises using non-linear regression to curve fit said one or more mathematical equations to said plot of said output signal.

7. A computer-readable storage medium encoded with instructions for causing a computer to perform the method according to claim 1.

8. A method of determining individual string resistance in a network of resistive strings, each resistive string having a unique preselected impedance connected thereto, comprising the steps of:

applying a frequency-varying input signal to said network such that portions of said frequency-varying input propagate through each resistive string of said network;

recording an output signal from said network, said output signal resulting from said portions of said frequency-varying input signal propagating through said resistive strings of said network; and determining a resistance for each resistive string in said network based on said frequency-varying input signal, said unique preselected impedance of each resistive string, and said output signal, wherein said step of determining comprises analyzing peaks in a plot of said output signal to determine said resistance for each resistive string as a curve-fit parameter derived from a nonlinear regression.

9. The method according to claim 8, wherein said plot of said output signal is an amplitude plot.

10. The method according to claim 8, wherein said plot of said output signal is a phase plot.

11. A computer-based system for determining individual string resistance in a network of resistive strings, each resistive string having a unique preselected impedance connected thereto, comprising:
- a computing unit;
- a waveform generator controllable by said computing unit to generate a frequency-varying input signal, said waveform generator connected to said network such that said frequency-varying input signal propagates through each resistive string of said network; and
- a microcontroller controllable by said computing unit to record an output signal from said network, said output signal composed of said frequency-varying input signal propagating through said resistive strings of said network;
- wherein said computing unit is programmed to determine a resistance for each resistive string in said network based on said frequency-varying input signal, said unique preselected impedance for each resistive string, and said output signal.

12. The system according to claim 11, wherein said network is a battery module and said resistive strings are battery cells of said battery module.

13. The system according to claim 11, wherein said network is a thermistor network and each resistive string is an individual thermistor.

14. The system according to claim 11, wherein said system is part of a battery charger application.

15. The system according to claim 11, wherein said network is a fuel cell and said resistive strings are single cells of said fuel cell module.

16. The system according to claim 11, wherein said network are multiple strain gauges and said resistive strings are single strain gauges of said network.

17. The system according to claim 11, wherein said resistive strings are in parallel with one another and said frequency-varying input signal is a voltage signal.

18. The system according to claim 11, wherein said resistive strings are in series with one another and said frequency-varying input signal is a current signal.

19. The system according to claim 11, wherein said unique preselected impedance for each resistive string is capacitive impedance.

20. The system according to claim 11, wherein said unique preselected impedance for each resistive string is inductive impedance.

21. The system according to claim 11, wherein said unique preselected impedance for each resistive string includes a capacitive impedance and inductive impedance combination that functions as a filtering circuit at certain frequencies of said frequency-varying input signal.

22. A method of resolving a resistance of an individual string, said individual string part of a either a parallel string network or a series string network, using a single input signal and a single output signal of said parallel or said series string network, comprising the steps of:

connecting a frequency-varying impedance component with known electrical characteristics in series with each individual string for said parallel string network or in parallel with each individual string for said series string network, or using multiple frequency-varying impedance components with known electrical characteristics both in parallel and series with each individual string for either said parallel or said series string network, wherein said electrical characteristics of said frequency-varying impedance component are based on network size, resistance resolution accuracy, and impedance characteristics needs;

applying said single input signal to said parallel or said series string network, said single input signal being a voltage signal for said parallel string network and a current signal for said series string network;

generating a symbolic representation of said single output signal as a function of said single input signal, said frequency-varying impedance component of each individual string, and said resistance of each individual string;

curve-fitting said symbolic representation to a plot of said single output signal resulting from application of said single input signal to said parallel or said series string network using non-linear regression, wherein said resistance for each individual string is a curve-fit parameter derived from said nonlinear regression; and correlating said unique predetermined electrical characteristics of each frequency-varying impedance component to said resistance for each individual string to thereby identify a location of said individual string.

* * * * *